US008790859B2

(12) United States Patent
Yun et al.

(10) Patent No.: US 8,790,859 B2
(45) Date of Patent: Jul. 29, 2014

(54) PHOTORESIST COMPOSITION AND METHOD OF FABRICATING THIN FILM TRANSISTOR SUBSTRATE

(75) Inventors: Sang-Hyun Yun, Suwon-si (KR); Woo-Seok Jeon, Seoul (KR); Jung-In Park, Suwon-si (KR); Hi-Kuk Lee, Yongin-si (KR); Byung-Uk Kim, Hwaseong-si (KR); Dong-Min Kim, Hwaseong-si (KR); Seung-Ki Kim, Hwaseong-si (KR); Ja-Hun Byeon, Hwaseong-si (KR)

(73) Assignee: Samsung Display Co., Ltd., Yongin (KR)

( * ) Notice: Subject to any disclaimer, the term of this patent is extended or adjusted under 35 U.S.C. 154(b) by 685 days.

(21) Appl. No.: 12/620,988

(22) Filed: Nov. 18, 2009

(65) Prior Publication Data

US 2010/0167476 A1 Jul. 1, 2010

(30) Foreign Application Priority Data

Dec. 29, 2008 (KR) .................. 10-2008-0135908

(51) Int. Cl.
*G03F 7/004* (2006.01)
*G03F 7/022* (2006.01)
*G03F 7/023* (2006.01)
*H01L 29/66* (2006.01)
*H01L 21/336* (2006.01)

(52) U.S. Cl.
CPC .................. *G03F 7/0236* (2013.01); *H01L 29/66765* (2013.01)
USPC ........ 430/270.1; 430/311; 430/313; 430/317; 430/319; 438/158; 438/780; 257/E21.414

(58) Field of Classification Search
CPC .............. G03F 7/0236; H01L 29/66765
USPC ........ 438/780, 158; 257/E21.414; 430/270.1, 430/311, 313, 317, 319
See application file for complete search history.

(56) References Cited

U.S. PATENT DOCUMENTS 3,639,185 A * 2/1972 Colom et al. ............... 430/323
3,640,992 A * 2/1972 Schafer et al. .............. 534/557

(Continued)

FOREIGN PATENT DOCUMENTS

JP 08-160614 6/1996
JP 08-295716 11/1996

(Continued)

OTHER PUBLICATIONS

Translation of JP 10-60067 from PAJ, Nov. 4, 2012.*

(Continued)

*Primary Examiner* — Mary Wilczewski
(74) *Attorney, Agent, or Firm* — H.C. Park & Associates, PLC

(57) ABSTRACT

The present invention relates to a photoresist composition for digital exposure and a method of fabricating a thin film transistor substrate. The photoresist composition for digital exposure includes a binder resin including a novolak resin and a compound represented by the chemical formula (1), a photosensitizer including a diazide-based compound, and a solvent:

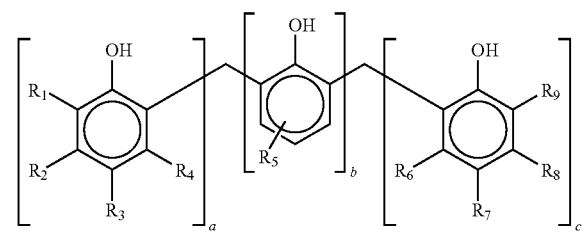

(1)

wherein $R_1$-$R_9$ each include a hydrogen atom, an alkyl group, or a benzyl group, a is an integer from 0 to 10, b is an integer from 0 to 100, and c is an integer from 0 to 10.

10 Claims, 10 Drawing Sheets

(56) References Cited

U.S. PATENT DOCUMENTS

| | | | |
|---|---|---|---|
| 4,529,682 A * | 7/1985 | Toukhy | 430/190 |
| 4,587,196 A * | 5/1986 | Toukhy | 430/192 |
| 4,588,670 A * | 5/1986 | Kelly et al. | 430/165 |
| 4,626,492 A * | 12/1986 | Eilbeck | 430/191 |
| 4,732,837 A * | 3/1988 | Potvin et al. | 430/192 |
| 4,892,801 A * | 1/1990 | Potvin et al. | 430/193 |
| 4,957,846 A | 9/1990 | Jeffries, III et al. | |
| 5,162,190 A * | 11/1992 | Zahn et al. | 430/190 |
| 5,196,289 A * | 3/1993 | Jeffries et al. | 430/192 |
| 5,232,819 A * | 8/1993 | Jeffries et al. | 430/326 |
| 5,275,909 A * | 1/1994 | Jayaraman et al. | 430/165 |
| 5,284,737 A * | 2/1994 | Jayaraman et al. | 430/326 |
| 5,290,656 A * | 3/1994 | Uetani et al. | 430/165 |
| 5,302,688 A * | 4/1994 | Jeffries et al. | 528/155 |
| 5,429,905 A * | 7/1995 | Tan et al. | 430/192 |
| 5,541,033 A * | 7/1996 | Blakeney et al. | 430/192 |
| 5,547,814 A * | 8/1996 | Blakeney et al. | 430/326 |
| 5,602,260 A * | 2/1997 | Blakeney et al. | 549/362 |
| 5,853,948 A * | 12/1998 | Sawano et al. | 430/166 |
| 5,866,724 A * | 2/1999 | Ichikawa et al. | 568/720 |
| 5,932,389 A * | 8/1999 | Zampini | 430/192 |
| 6,177,226 B1 * | 1/2001 | Kurihara et al. | 430/191 |
| 6,207,340 B1 * | 3/2001 | Kurihara et al. | 430/192 |
| 6,296,992 B1 * | 10/2001 | Kurihara et al. | 430/326 |
| 6,448,383 B2 * | 9/2002 | Yamanaka et al. | 534/557 |
| 6,593,043 B2 * | 7/2003 | Suwa et al. | 430/18 |
| 6,933,087 B2 * | 8/2005 | Suwa et al. | 430/7 |
| 7,291,439 B2 * | 11/2007 | Park et al. | 430/191 |
| 7,378,230 B2 * | 5/2008 | Kang et al. | 430/326 |
| 2005/0089790 A1 * | 4/2005 | Lee et al. | 430/141 |
| 2006/0183048 A1 * | 8/2006 | Masuda et al. | 430/141 |
| 2007/0009833 A1 * | 1/2007 | Park et al. | 430/270.1 |
| 2007/0111412 A1 * | 5/2007 | Oh et al. | 438/158 |
| 2009/0258497 A1 * | 10/2009 | Park et al. | 438/694 |
| 2010/0167476 A1 * | 7/2010 | Yun et al. | 438/158 |

FOREIGN PATENT DOCUMENTS

| | | | | |
|---|---|---|---|---|
| JP | 10-60067 | * | 3/1998 | C08G 8/08 |
| JP | 10-232491 | * | 9/1998 | G03F 7/022 |
| JP | 11-119425 | * | 4/1999 | G03F 7/004 |
| JP | 11-352680 | | 12/1999 | |
| JP | 2004-233846 | * | 8/2004 | G03F 7/022 |
| JP | 2004-309720 | * | 11/2004 | G03F 7/023 |
| JP | 2004-361501 | * | 12/2004 | G03F 7/022 |
| JP | 2005-4172 | * | 1/2005 | G03F 1/13 |
| JP | 2005-107130 | * | 4/2005 | G03F 7/022 |
| JP | 2005-107131 | * | 4/2005 | G03F 7/004 |
| JP | 2005-221515 | * | 8/2005 | G03F 7/023 |
| JP | 2007-304591 | * | 11/2007 | G03F 7/008 |
| JP | 2009-31351 | * | 2/2009 | G03F 7/004 |
| WO | WO 2004053595 | * | 6/2004 | G03F 1/13 |

OTHER PUBLICATIONS

Translation of JP 2004-233846 from PAJ.*

* cited by examiner

PHOTORESIST COMPOSITION AND METHOD OF FABRICATING THIN FILM TRANSISTOR SUBSTRATE

CROSS-REFERENCE TO RELATED APPLICATION

This application claims priority from Korean Patent Application No. 10-2008-0135908, filed on Dec. 29, 2008, which is hereby incorporated by reference for all purposes as if fully set forth herein.

BACKGROUND OF THE INVENTION

1. Field of the Invention

The present invention relates to a photoresist composition for digital exposure and a method of fabricating a thin film transistor (TFT) substrate using the photoresist composition.

2. Discussion of the Background

Liquid crystal displays (LCDs) are some of the most widely used flat panel displays. The LCD includes two substrates on which field-generating electrodes are formed, and a liquid crystal layer that is interposed between the substrates. In the LCD, a voltage is applied to the electrodes to rearrange the liquid crystal molecules of the LCD, thereby controlling the quantity of transmitted light.

An LCD includes micro-circuit patterns, which are generally formed by photolithography. A photoresist and a mask are used during the photolithography process for forming a micro-circuit pattern. During the photolithography process, light is irradiated into a mask having a micro-circuit pattern shape. Only the light passing through the mask is irradiated into the photoresist, and a photoresist pattern is formed by the light irradiated into the photoresist. The photoresist is then subjected to an etching process, thereby forming the micro-circuit pattern. According to a recent trend for large-screen sized LCDs, masks used in the manufacture of the LCDs are becoming large-sized, which increases the mask fabrication cost, thereby increasing the LCD's manufacturing cost. Accordingly, a method of manufacturing an LCD by maskless photolithography using a digital exposure apparatus has recently been proposed.

However, a laser beam, i.e., a light source used during digital exposure, has an energy density that is close to a Gaussian distribution. Thus, the quality of light is constant at a laser beam overlapping area, while the quality of light is not constant around the laser beam overlapping area. Accordingly, when photoresist patterns are formed through digital exposure, the photoresist patterns positioned at peripheral areas of laser beam irradiation spots may not provide a taper angle and a pattern profile that are satisfactory for an etching process. Therefore, an object of the present invention is to develop a photoresist composition that may overcome the disadvantages associated with digital exposure.

SUMMARY OF THE INVENTION

The present invention provides a photoresist composition for forming a photoresist pattern that may be used during digital exposure.

The present invention also provides a method of fabricating a thin film transistor substrate using the photoresist composition.

Additional features of the invention will be set forth in the description which follows, and in part will be apparent from the description, or may be learned by practice of the invention.

The present invention discloses a photoresist composition for digital exposure, the photoresist composition including a binder resin including a novolak resin and a compound represented by the chemical formula (1), a photosensitizer including a diazide-based compound, and a solvent:

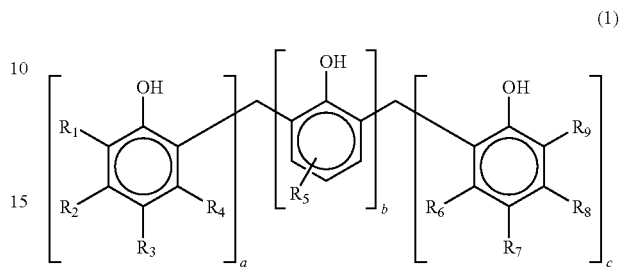

(1)

In the chemical formula (1), $R_1$-$R_9$ each include a hydrogen atom, an alkyl group, or a benzyl group, a is an integer from 0 to 10, b is an integer from 0 to 100, and c is an integer from 0 to 10.

The present invention also discloses a method of fabricating a TFT substrate using a photoresist composition, the method including forming a gate electrode on a substrate, forming a gate insulating film on the gate electrode, forming a semiconductor layer on the gate insulating film, forming a source electrode and a drain electrode on the semiconductor layer, and forming a pixel electrode connected to the drain electrode, wherein at least one of the respective steps includes a photolithography process, which includes the steps of forming a layer made of either a conductive material or a non-conductive material, forming a composition including a binder resin having a novolak resin and a compound is represented by the chemical formula (1), a photosensitizer including a diazide-based compound, and a solvent, forming a photoresist film using the composition, forming a photoresist pattern by exposing and developing the photoresist film, and etching the layer using the photoresist pattern:

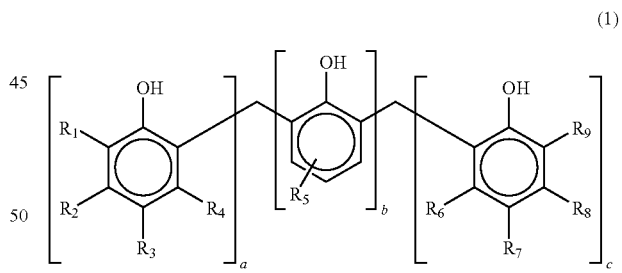

(1)

In the chemical compound (I), $R_1$-$R_9$ each include a hydrogen atom, an alkyl group, or a benzyl group, a is an integer from 0 to 10, b is an integer from 0 to 100, and c is an integer from 0 to 10.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE INVENTION

Figure 1A:
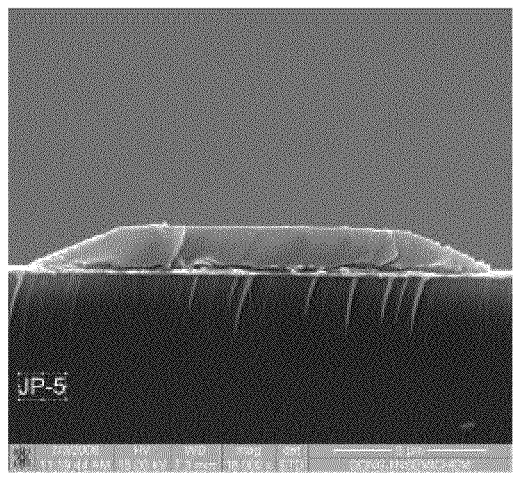
FIG. 1A and FIG. 1B show a photoresist pattern formed using a photoresist is composition prepared in Example 1.
Figure 1B:
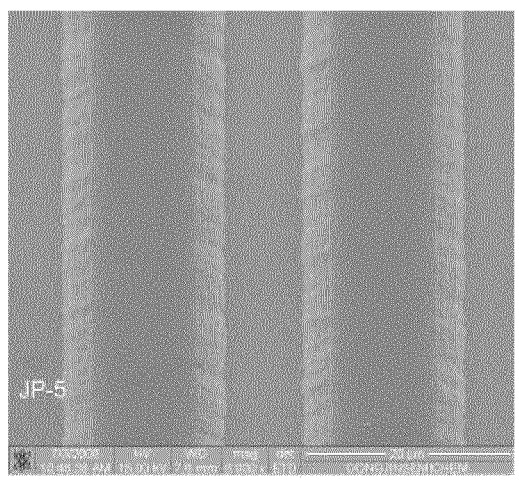
Figure 2A:
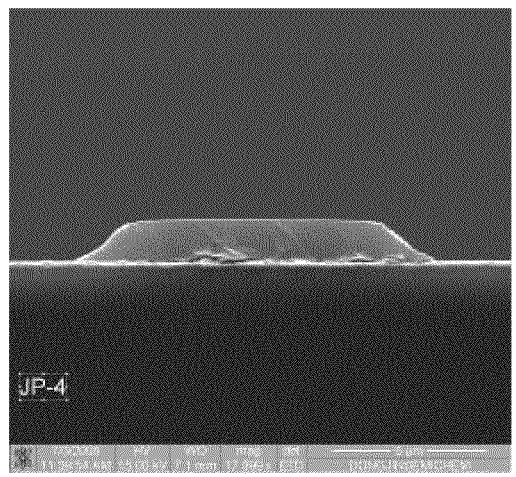
FIG. 2A and FIG. 2B show a photoresist pattern formed using a photoresist composition prepared in Example 2.
Figure 2B:
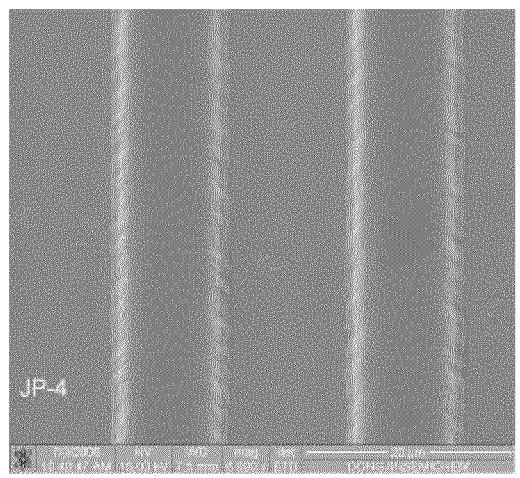
Figure 3A:
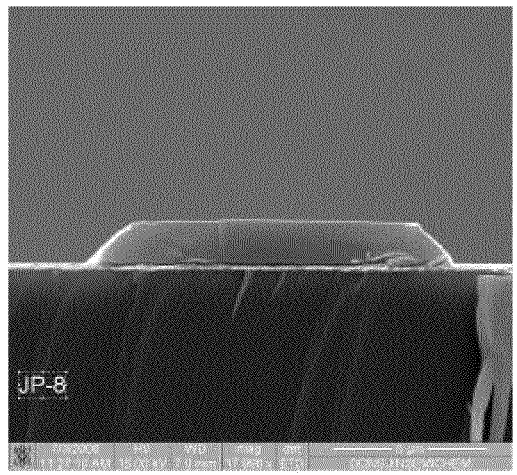
FIG. 3A and FIG. 3B show a photoresist pattern formed using a photoresist composition prepared in Example 3.
Figure 3B:
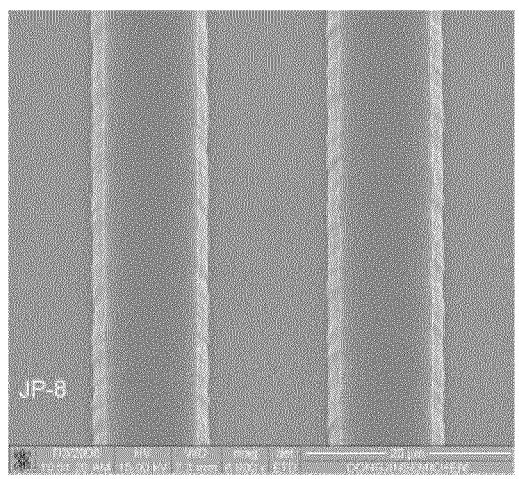

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Spatially relative terms, such as "below," "beneath," "lower," "above," "upper" and the like, may be used herein for ease of description to describe one element or feature's relationship to another element(s) or feature(s) as shown in the figures. It will be understood that the spatially relative terms are intended to encompass different orientations of the device in use or operation in addition to the orientation depicted in the figures.

Exemplary embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing.

Hereinafter, photoresist compositions for digital exposure according to exemplary embodiments of the present invention will be described in detail. In addition, a method of fabricating a TFT substrate using the photoresist composition for digital exposure according to exemplary embodiments of the present invention will be described in detail with reference to the accompanying drawings.

A photoresist composition according to an exemplary embodiment of the present invention is used during a photolithography process, in particular, during a photolithography process using a digital exposure apparatus.

The photoresist composition for digital exposure according to an exemplary embodiment of the present invention includes a binder resin including a novolak resin and a compound represented by the chemical formula (1), a photosensitizer including a diazide-based compound, and a solvent:

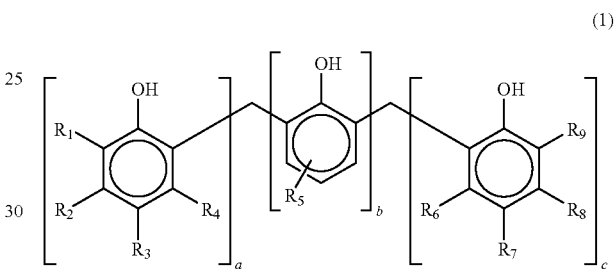

(1)

In chemical formula (1), $R_1$-$R_9$ independently represent a hydrogen atom, an alkyl group or a benzyl group, a is an integer from 0 to 10, b is an integer from 0 to 100, and c is an integer from 0 to 10.

According to the present exemplary embodiment, the binder resin includes the novolak resin and the compound represented by the chemical formula (1). The novolak resin and the compound represented by the chemical formula (1) included in the binder resin are alkaline-soluble, that is, soluble in alkaline aqueous solutions such as alkaline aqueous developing solutions. In addition, the binder resin may include a hydroxyl group to improve its solubility in water. The binder resin forms a framework of the photoresist pattern.

The novolak resin may have a weight average molecular weight ranging from about 2,000 to 20,000, and the compound represented by the chemical formula (1) may have a weight average molecular weight ranging from about 2,000 to 20,000.

If the weight average molecular weight of each of the novolak resin and the compound represented by the chemical formula (1) is less than 2,000, it may be difficult to obtain a desired photoresist viscosity for digital exposure, and the dissolved extent of the novolak resin and the compound represented by the chemical formula (1) in the developing solution becomes severe. Thus, it may become difficult to form a desired film pattern within a predetermined tact time. If the weight average molecular weight of the novolak resin and the compound represented by the chemical formula (1) exceeds 20,000, the viscosity of the photoresist composition may be excessive, which may cause the photoresist composition to be difficult to process when the photoresist pattern is stripped.

The novolak resin may have a structure represented by the following chemical formula (3):

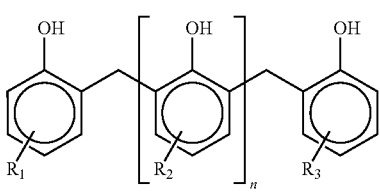

(3)

wherein n is an integer from 1 to 100, and $R_1$-$R_3$ independently represent at least one selected from the group consisting of a hydrogen atom, an alkyl group, an alkoxy group, a halogen atom and a nitro group.

The novolak resin is synthesized by blending meta- and para-aromatic compounds and heating the same. Here, the meta-aromatic compound tends to increase the photospeed of the photoresist composition. The para-aromatic compound tends to slow down the photospeed of the photoresist composition. Thus, an appropriate amount of photosensitizer may be selected according to the chemical structure of the synthesized novolak resin. Here, typical examples of the aromatic compound include cresols. Thus, novolak resin can be synthesized using meta- and/or para-cresols. Here, in order to select an is appropriate amount of photosensitizer, the meta-cresol novolak component and the para-cresol component is preferably in a mixing ratio by weight ranging from about 30:70 to 70:30.

The compound represented by the chemical formula (1) included in the binder resin is a polysubstituted novolak resin and may be derived from para-cresol, ortho-cresol, meta-cresol, 2,4-xylenol, 2,5-xylenol, 3,4-xylenol, or the like. The compound represented by the chemical formula (1) can improve pattern profile and resolution features of a photoresist formed by digital exposure. The compound represented by the chemical formula (1) may be a compound having repeating units containing meta-cresol, para-cresol, and trimethyl phenol connected to each other.

The amount of the novolak resin and the compound represented by the chemical formula (1) included in the binder resin preferably should not exceed 99 weight % or be less than 1 weight %, because of potential negative effects on photospeed, pattern file, and resolution power of the photoresist composition. Accordingly, in the two-component binder resin, the novolak resin and the compound represented by the chemical formula (1) are preferably mixed in a mixing ratio by weight ranging from about 1:99 to 80:20.

In the photoresist composition used for digital exposure according to the present exemplary embodiment, if the amount of the binder resin exceeds 30 weight %, dissolution of the photoresist composition in a developing solution may be slowed during a developing process following the exposure. Thus, the sensitivity of the photoresist is composition relative to exposure energy may not be satisfactory, which may extend an exposure time, ultimately lengthening a film patterning time.

If the amount of the binder resin in the photoresist composition is less than 5 weight %, the dissolution of the photoresist composition in a developing solution may be accelerated, and the residual film ratio of finally formed film patterns can be reduced. Thus, the amount of the binder resin in the photoresist composition for digital exposure according to the present exemplary embodiment is preferably in a range of 5-30 weight %.

Next, the photosensitizer included in the photoresist composition for digital exposure according to the present exemplary embodiment will be described.

The photosensitizer includes a diazide-based compound represented by the chemical formula (4):

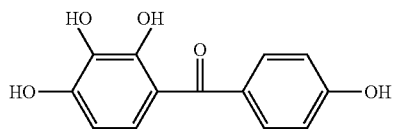

(4)

Chemical formula (4) is prepared by reacting such compounds as polyhydroxy benzophenone, 1,2-naphthoquinone diazide, or 2-diazo-1-naphthol-5-sulfonic acid.

For example, the diazide-based compound may be 2,3,4-trihydroxybenzophenone-1,2-naphthoquinonediazide-5-sulfonate (to be referred to as a 'diazide-based compound 1' hereinafter) obtained by esterification of trihydroxybenzophenone and 2-diazo-1-naphthol-5-sulfonic acid, and 2,3,4,4'-tetrahydroxybenzophenone-1,2-naphthoquinonediazide-5-sulfonate (to be referred to as a 'diazide-based compound 2' hereinafter) obtained by esterification of tetrahydroxybenzophenone and 2-diazo-1-naphthol-5-sulfonic acid. Each of these can be used independently or in combination.

The diazide-based compound 1 and the diazide-based compound 2 are represented by the following chemical formulas:

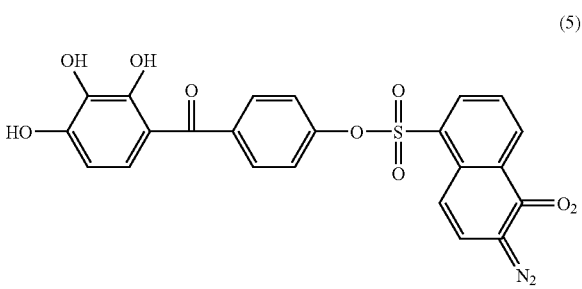

(5)

2,3,4-trihydroxybenzophenone-1,2-naphthoquinonediazide-5-sulfonate

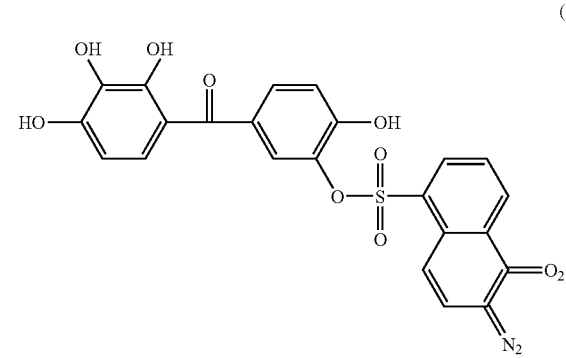

(6)

2,3,4,4'-tetrahydroxybenzophenone-1,2-naphthoquinonediazide-5-sulfonate

The photosensitizer according to the present exemplary embodiment may further include the compound represented by the chemical formula (2), which may allow photospeed of the photoresist composition to be easily adjusted and the resolution power to be improved during digital exposure:

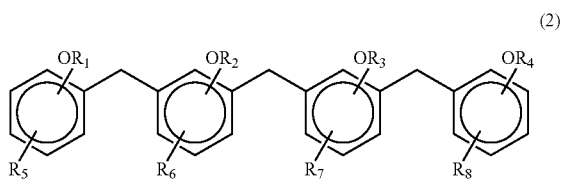

(2)

In chemical formula (2), $R_1$-$R_4$ independently represent 2-diazo-1-naphthol-5-sulfonyl, a hydrogen atom, or an alkyl group, and $R_5$-$R_8$ independently represent a hydrogen atom, an alkyl group, or a benzyl group. The compound represented by the chemical formula (2) may be bis[4-hydroxy-3-(2-hydroxy-5-methylbenzyl)-5-dimethylphenyl]methane-1,2-naphthoquinone diazide-5-sulfonate.

The amount of the diazide-based compound and the compound represented by is the chemical formula (2) included in the photosensitizer preferably should not exceed 99 weight % or be less than 1 weight %, because of potential negative effects on photospeed and resolution power of the photoresist composition. Accordingly, the diazide-based compound and the compound represented by the chemical formula (2) included in the photosensitizer are preferably mixed in a mixing ratio by weight ranging from about 1:99 to 80:20.

The taper angle of a photoresist pattern or quality of a pattern profile may depend upon the photosensitizer.

In the photoresist composition for digital exposure according to the present exemplary embodiment, if the amount of the photosensitizer exceeds 10 weight %, the quantity of energy sensed by a light source is increased, which may make it difficult to form a pattern at a desired exposure energy band. However, if the amount of the photosensitizer is less than 2 weight %, a photoresist tends to be excited by a small quantity of exposure energy, which may also make it difficult to form a pattern at a desired exposure energy band. Therefore, the amount of the photosensitizer contained in the photoresist composition for digital exposure according to the present exemplary embodiment is preferably 2-10 weight %.

Next, the solvent included in the photoresist composition for digital exposure according to the present exemplary embodiment will be described.

The solvent is capable of dissolving the binder resin and photosensitizer. In the present exemplary embodiment, the solvent is at least one selected form the group consisting is of propyleneglycol monoethylether acetate (PGMEA), ethyl lactate (EL), ethyl cellosolve acetate (ECA), 2-methoxyethylacetate, γ-butyrolactone (GBL), methyl methoxy propionate (MMP), ethyl-β-ethoxypropionate (EEP), propylene glycol monomethyl ether (PGME), n propyl acetate (nPAC), and n-butyl acetate (nBA).

Based on the total amount of the photosensitive composition for digital exposure according to the present exemplary embodiment, except for the binder resin and the photosensitizer, the remainder of the solvent is used. If the amount of solvent exceeds 95 weight %, the residual film ratio may undesirably deteriorate. If the amount of solvent is less than 57 weight %, the dissolution capabilities of the binder resin and the photosensitizer may be undesirably lowered.

Meanwhile, the photoresist composition according to the present exemplary embodiment may further comprise at least one selected from the group consisting of a coloring agent, a dying agent, a streation preventing agent, a plasticizer, an adhesion promoting agent, a photospeed enhancer, and a surfactant, if needed.

The surfactant will now be described in more detail. The surfactant may be provided for the purpose of improving coating characteristics of the photoresist composition according to the present exemplary embodiment.

Fluorine (F) and/or silicon (Si) based surfactants may be used singly or in combination. If the amount of the surfactant exceeds 0.4 weight %, the coating characteristic of the photoresist composition may deteriorate. If the amount of surfactant is less than 0.05 weight %, surface smoothness of the photoresist film may deteriorate. Therefore, the amount of surfactant in the photoresist composition is preferably 0.05-0.4 weight %.

The following examples illustrate the photoresist composition for digital exposure according to the present exemplary embodiment in more detail. However, it is understood that the present invention is not limited by these examples. Unless otherwise is specified, the percentage and the mixture ratio represent weight percent and weight ratio.

Example 1

A photoresist composition was prepared by dissolving 20 g of a binder resin and 4 g of a photosensitizer in 60 g of propylene glycol methyl ether acetate (PGMEA) as a solvent and blending the same. The binder resin includes a novolak resin and a polysubstituted novolak resin represented by the chemical formula (1) mixed in a mixing ratio of 70:30 by weight. The novolak resin has meta-cresol and para-cresol mixed in a mixing ratio of 4:6 by weight. The polysubstituted novolak resin has meta-cresol, para-cresol and trimethylphenol mixed in a mixing ratio of 5:4:2 by weight. The photosensitizer includes a diazide compound 2 and a compound represented by the chemical formula (2) exemplified by bis [4-hydroxy-3-(2-hydroxy-5-methylbenzyl)-5-dimethylphenyl]methane-1,2-naphthoquinone diazide-5-sulfonate mixed in a mixing ratio of 40:60.

Example 2

A photoresist composition was prepared by dissolving 20 g of a binder resin and 4 g of a photosensitizer in 60 g of propylene glycol methyl ether acetate (PGMEA) as a solvent and blending the same. The binder resin includes a novolak resin and a polysubstituted novolak resin represented by the chemical formula (1) mixed in a mixing ratio of 30:70 by weight. The novolak resin has meta-cresol and para-cresol mixed in a mixing ratio of 4:6 by weight. The polysubstituted novolak resin has meta-cresol, para-cresol and trimethylphenol mixed in a mixing ratio of 5:4:2 by weight. The photosensitizer includes a diazide compound 2 and a compound represented by the chemical formula (2) exemplified by bis [4-hydroxy-3-(2-hydroxy-5-methylbenzyl)-5-dimethylphenyl]methane-1,2-naphthoquinone diazide-5-sulfonate mixed in a mixing ratio of 40:60.

Example 3

A photoresist composition was prepared by dissolving 20 g of a binder resin and 4 g of a photosensitizer in 60 g of propylene glycol methyl ether acetate (PGMEA) as a solvent and blending the same. The binder resin includes a novolak resin and a polysubstituted novolak resin represented by the chemical formula (1) mixed in a mixing ratio of 30:70 by weight. The novolak resin has meta-cresol and para-cresol mixed in a mixing ratio of 4:6 by weight. The polysubstituted novolak resin has meta-cresol, para-cresol and trimethylphenol mixed in a mixing ratio of 5:4:2 by weight. The photosensitizer includes a diazide compound 2 and a compound represented by the chemical formula (2) exemplified by bis [4-hydroxy-3-(2-hydroxy-5-methylbenzyl)-5-dimethylphenyl]methane-1,2-naphthoquinone diazide-5-sulfonate mixed in a mixing ratio of 10:90.

Comparative Example

A photoresist composition was prepared by dissolving 20 g of a binder resin and 4 g of a photosensitizer in 60 g of propylene glycol methyl ether acetate (PGMEA) as a solvent and blending the same. The binder resin includes a novolak resin having meta-cresol and para-cresol mixed in a mixing ratio of 4:6 by weight. The photosensitizer includes a diazide compound 2 and a diazide compound 1 mixed in a mixing ratio of 30:70.

Experimental Example

Each photoresist composition prepared in Examples 1-3 and Comparative Example 1 was applied to a glass substrate at a predetermined speed by spin coating, followed by drying under a reduced pressure of 0.1 Torr or less for 60 seconds. Subsequently, the substrate coated with the photoresist composition was soft baked at 110° C. for 90 seconds to form a 1.60 μm thick photoresist film. Next, thickness uniformity of the photoresist film was measured. Then, the photoresist film was exposed to light having a wavelength of 405 nm using a digital exposure apparatus. Subsequently, the photoresist film was developed using an aqueous solution containing tetramethylammonium hydroxide at room temperature to form a photoresist pattern.

1) Photospeed and Residual Film Ratio

*Initial Thickness of Photoresist Film=(Thickness of Loss)+(Thickness of Residual Photoresist Film)

*Residual Film Ratio=(Thickness of Residual Photoresist Film/Initial Thickness of Photoresist Film)

The photospeed was obtained by measuring energy when the photoresist film was completely dissolved according to the exposed energy under given developing conditions. The residual film ratio was obtained by measuring thicknesses of loss in the photoresist film before and after the developing step.

2) Taper Angle and Pattern Profile

As described above, after forming the photoresist pattern, the taper angle and pattern profile of each photoresist pattern were measured using a Scanning Electron Microscope (SEM). The measurement results are shown in Table 1.

TABLE 1

| | Photospeed (mJ/cm$^2$) | Residual Film Ratio (%) | Taper angle (°) | Pattern Profile |
|---|---|---|---|---|
| Example 1 | 45 | 98 | 30 | ⊚ |
| Example 2 | 45 | 98 | 40 | ⊚ |
| Example 3 | 45 | 99 | 55 | ⊚ |
| Comparative Example | 45 | 94 | 15 | X |

In Table 1, the ⊚ and X marks indicate good pattern profile and poor pattern profile, respectively.

As shown in Table 1, the photoresist compositions prepared in Examples 1-3 demonstrated greater taper angles and better pattern profiles than the photoresist composition prepared in Comparative Example. The greater the taper angle and the better the pattern profile, the larger the processing margin of the photoresist pattern, so a pattern having a desired shape may be easily achieved.

The photoresist compositions prepared in Examples 1-3, in which digital exposure was employed, may more easily achieve the desired photoresist patterns than the photoresist composition prepared in the Comparative Example.

Since the photoresist composition prepared in Example 1 further includes the is compound represented by the chemical formula (1) in the binder resin and the compound represented by the chemical formula (2) in the photosensitizer, it is more advantageously used for digital exposure than the photoresist composition prepared in Comparative Example, in which the compounds represented by the chemical formulas (1) and (2) are not included.

Figure 4A:
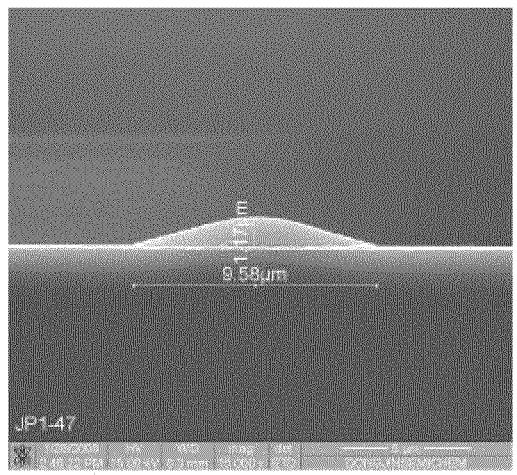
FIG. 4A and FIG. 4B show a photoresist pattern formed using a photoresist composition prepared in a Comparative Example.
Figure 4B:
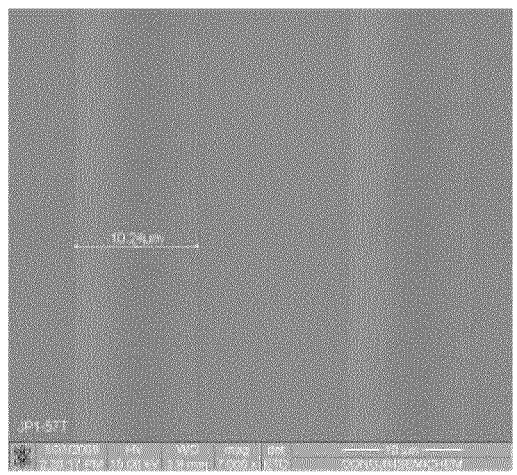

FIG. 1A, FIG. 1B, FIG. 2A, FIG. 2B, FIG. 3A, and FIG. 3B show photoresist patterns formed by the photoresist compositions prepared in Examples 1-3, and FIG. 4A and FIG. 4B show photoresist patterns formed by the photoresist composition prepared in the Comparative Example.

Referring to FIG. 1A, FIG. 1B, FIG. 2A, FIG. 2B, FIG. 3A, and FIG. 3B, FIG. 4A, and FIG. 4B, the photoresist patterns formed by the photoresist compositions prepared in Examples 1-3 demonstrated greater taper angles and better pattern profiles than the photoresist patterns formed by the photoresist composition prepared in the Comparative Example. Therefore, the photoresist composition prepared in Example 1 can be advantageously used in forming a microcircuit pattern using a maskless digital exposure apparatus.

A method of fabricating a TFT substrate according to another embodiment of the present invention will be described in detail below. Photoresist compositions, photoresist films, and photoresist patterns used in this exemplary embodiment are substantially the same as those in the exemplary embodiment described above, and repeated explanations will not be made.

Figure 5:
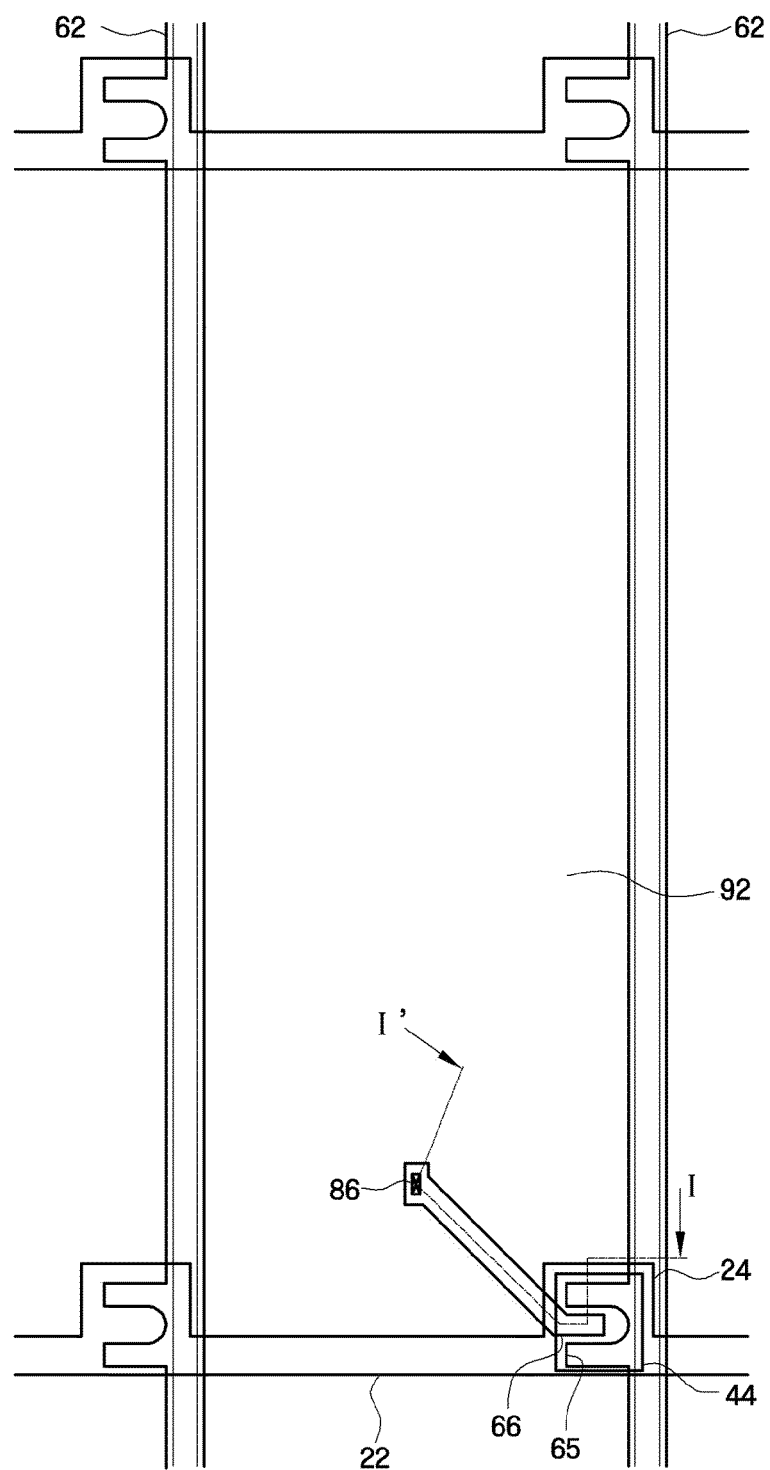
FIG. 5 is a layout view of a TFT substrate according an exemplary embodiment of the present invention.
Figure 6:
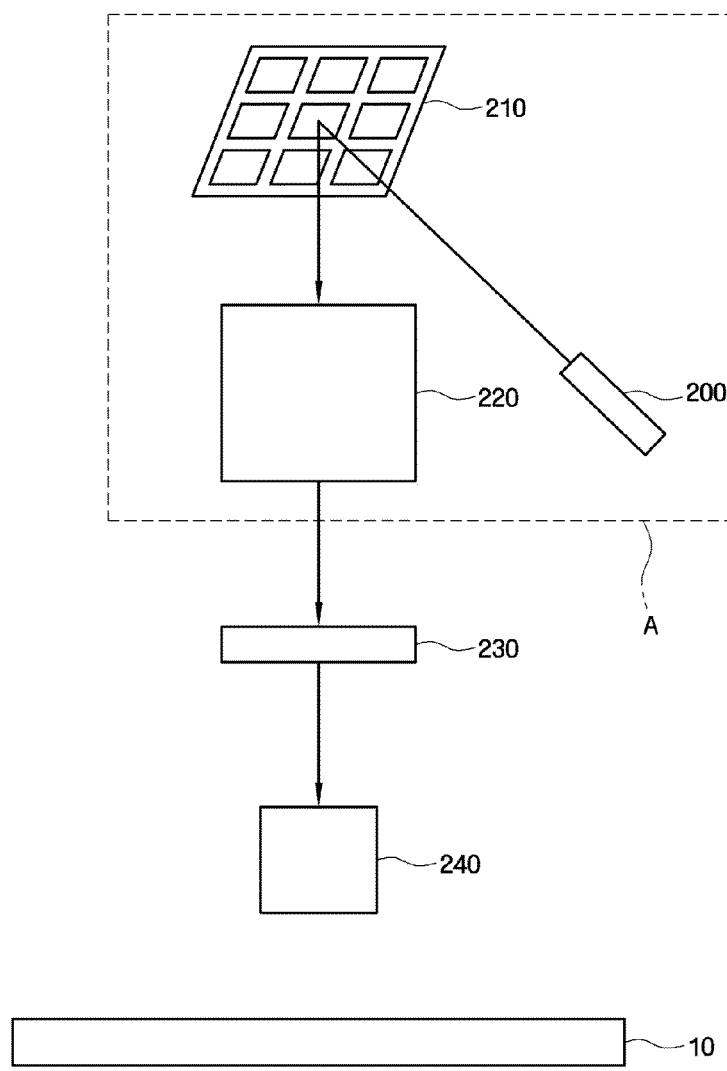
FIG. 6 is a schematic diagram of a maskless digital exposure apparatus used in an exemplary embodiment of the present invention.
Figure 7:
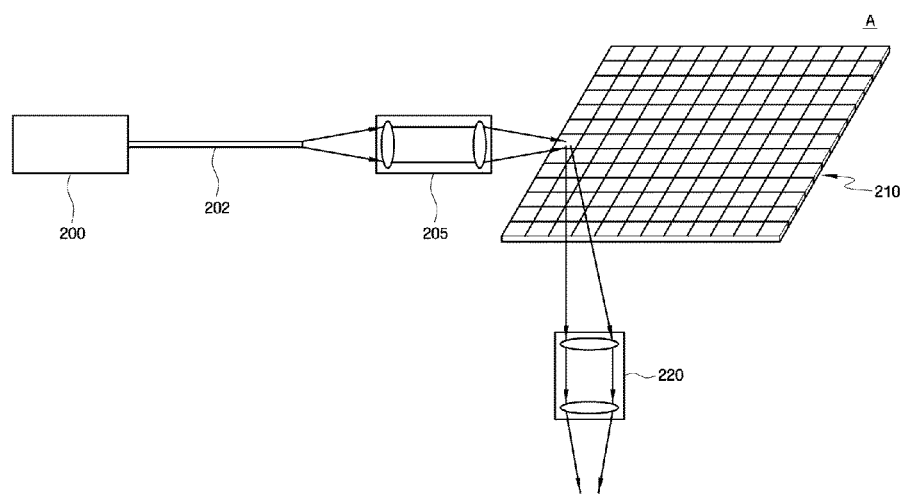
FIG. 7 is a diagram showing a portion "A" shown in FIG. 6.
Figure 8:
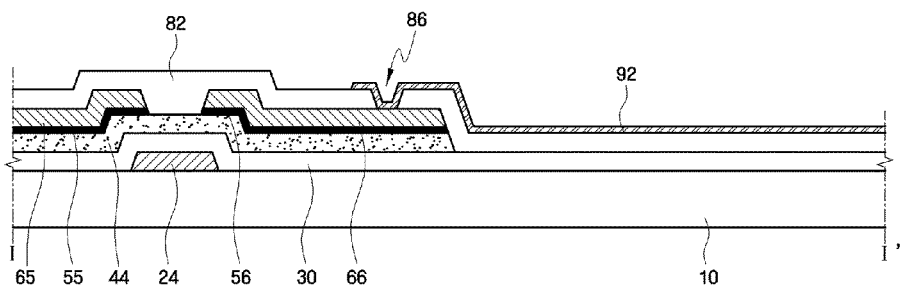
FIG. 8 is a cross-sectional view taken along line I-I' of FIG. 5.

FIG. 5 is a layout view of a TFT substrate according the present exemplary embodiment, FIG. 6 is a schematic diagram of a maskless digital exposure apparatus used in the present exemplary embodiment, FIG. 7 is a diagram illustrating a portion "A" of the maskless digital exposure apparatus shown in FIG. 6, and FIG. 8 is a cross-sectional view taken along line I-I' of FIG. 5.

Referring to FIG. 5, the TFT substrate according to the present exemplary embodiment includes a gate line 22 extending along a pixel boundary in a pixel row and a data line 62 extending along a pixel boundary in a pixel column. A thin film transistor (TFT), including the gate electrode 24, the semiconductor layer 44, the source electrode 65 and the drain electrode 66, is formed at a crossing area of the gate line 22 and the data line 62. A pixel electrode 92 is connected to the drain electrode 66 through a contact hole 86. The TFT substrate is formed using the photoresist composition prepared in Example 1 and a maskless digital exposure apparatus, which will be described below.

Referring to FIG. 6 and FIG. 7, the maskless digital exposure apparatus includes a laser beam oscillator 200, a digital micromirror device (DMD) 210, a projection lens 220, a focusing lens 230, and a camera 240.

The laser beam oscillator 200 oscillates a laser beam used as a light source for digital exposure. The laser beam oscillated during digital exposure has wavelengths of approximately 435 nm, 405 nm, and 365 nm. Since the photoresist composition prepared in Example 1 is optimized to light having a wavelength of approximately 405 nm, it is most effective to oscillate the laser beam having a wavelength of approximately 405 nm.

The DMD 210 reflects the laser beam oscillated from the laser beam oscillator 200. Here, a reflection spot of the laser beam is a photoresist film portion to be subjected to exposure. The laser beam oscillated from the laser beam oscillator 200 is incident into a first lens 205 via an optical fiber 202. The first lens 205 collects the incident laser beam and is provides the collected laser beam to the DMD 210. The laser beam supplied to the DMD 210 is reflected to the reflection spot by means of a micromirror provided in the DMD 210. The reflection spot of the laser beam can be controlled by information concerning a pattern to be formed by the photoresist film. The laser beam reflected by the micromirror is irradiated into the photoresist film of the substrate by the projection lens 220 and the focusing lens 230. The laser beam is used on the reflection spot. The information concerning a pattern to be formed on the substrate is input into a digital exposure device, and the reflection position of the laser beam is then controlled based on the input information, to perform maskless exposure on the photoresist film.

Figure 9A:
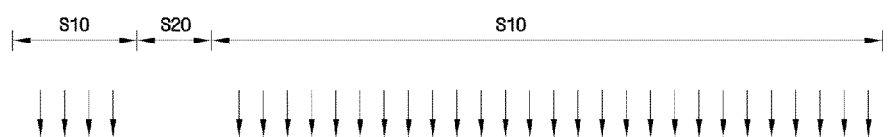
FIG. 9A, FIG. 9B, and FIG. 9C are cross-sectional views showing a formation step of a gate electrode according to an exemplary embodiment of the present invention.
Figure 9B:
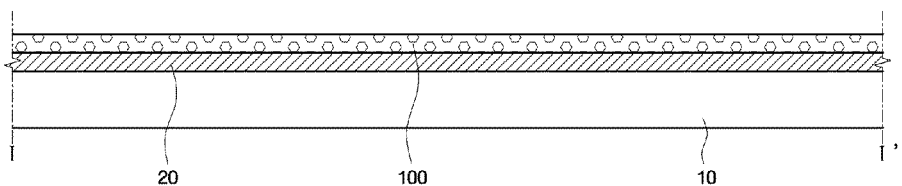
Figure 9C:
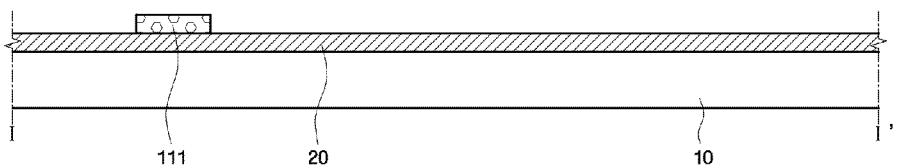
Figure 10A:
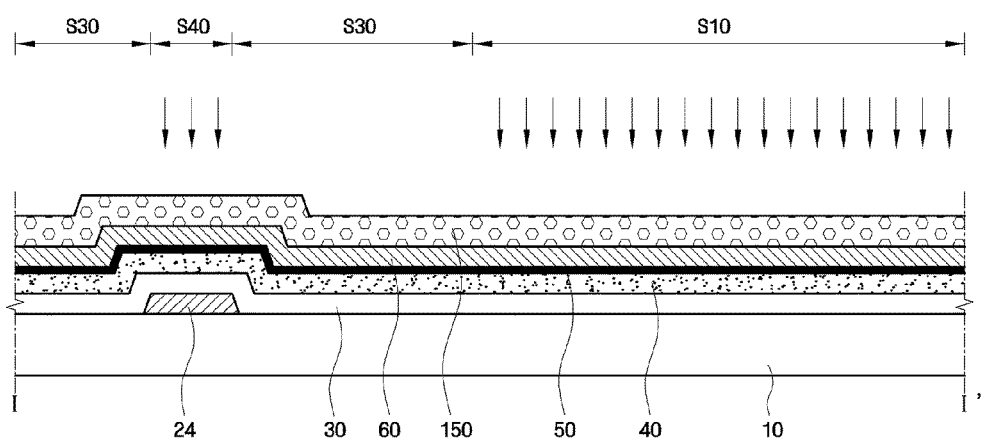
FIG. 10A, FIG. 10B, FIG. 10C, and FIG. 10D are cross-sectional views showing formation steps of a semiconductor layer and source and drain electrodes according to an exemplary embodiment of the present invention.
Figure 10B:
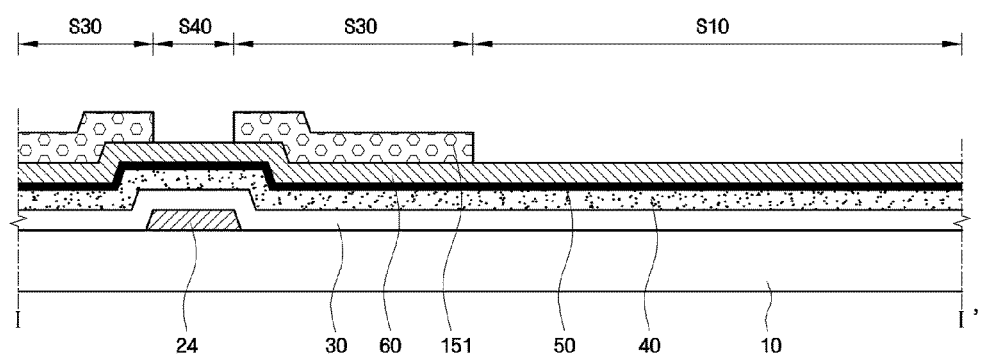
Figure 10C:
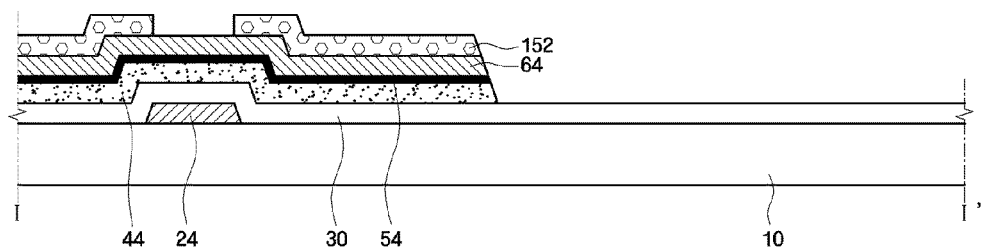
Figure 10D:
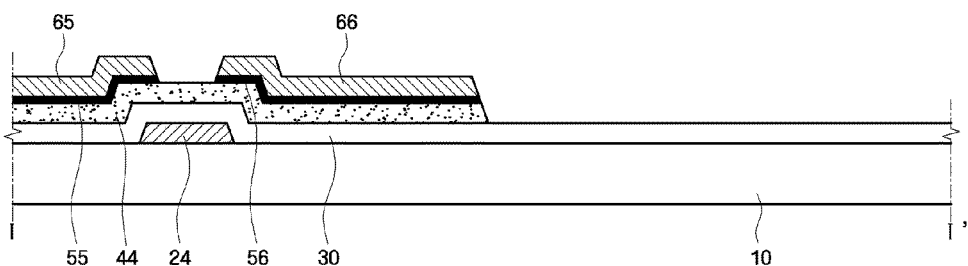
Figure 11:
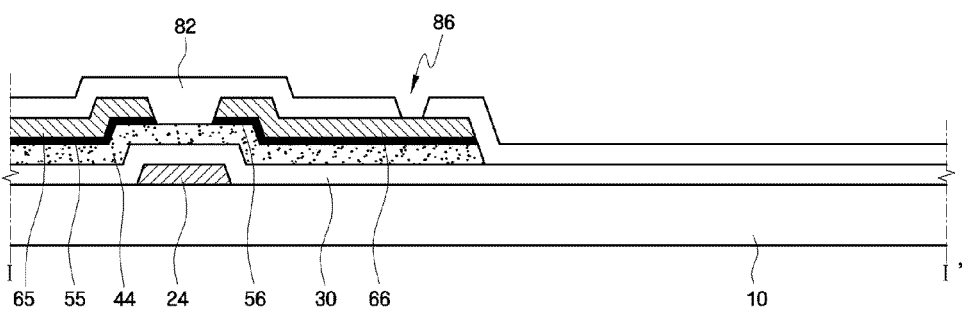
FIG. 11 is a cross-sectional view showing a formation step of a contact hole according to an exemplary embodiment of the present invention.

FIG. 9A, FIG. 9B, and FIG. 9C are cross-sectional views showing a formation step of a gate electrode according to the present exemplary embodiment, FIG. 10A, FIG. 10B, FIG. 10C, and FIG. 10D are cross-sectional views showing formation steps of a semiconductor layer and source and drain electrodes according to the present exemplary embodiment, and FIG. 11 is a cross-sectional views showing a formation step of a contact hole according to the present exemplary embodiment.

First, a formation step of a gate electrode according to the present exemplary embodiment will be described with reference to FIG. 9A, FIG. 9B, and FIG. 9C.

As shown in FIG. 9A, a first conductive layer 20 is formed on a substrate 10 by metallic deposition such as sputtering. A metal, such as Mo, Ti, Cu, AlNd, Al, Cr, Mo alloy, Cu alloy, or Al alloy, is used as the first conductive layer 20. The first conductive layer 20 may have a single layer or a stack of two more layers made of such a metal. Subsequently, the first photoresist film 100 is formed on the first conductive layer 20 using the photoresist composition prepared in Example 1. The photoresist composition prepared in Example 1 is positive photoresist. Accordingly, the portion exposed to light is removed during a developing process.

Next, a laser beam is irradiated into a non-patterning region S10 of the first photoresist film 100, where the gate electrode 24 is not formed, using the digital exposure apparatus shown in FIG. 6.

Therefore, the first photoresist film 100 exposed to the laser beam is removed during a developing process, and the first photoresist film 100 remains on a non-exposed region S20 where the gate electrode 24 is formed.

Accordingly, as shown in FIG. 9B, a first photoresist pattern 111 is formed. Next, the first conductive layer 20 having the first photoresist pattern 111 is etched to form the gate electrode 24, as shown in FIG. 9C.

Next, formation steps of a semiconductor layer and source and drain electrodes according to the present exemplary embodiment will be described with reference to FIG. 10A, FIG. 10B, FIG. 10C, and FIG. 10D.

Referring to FIG. 10A, FIG. 10B, FIG. 10C, and FIG. 10D, a gate insulating film 30 is formed on a substrate 10 having the gate electrode 24. A semiconductor layer 44 for forming a TFT channel is formed on the gate insulating film 30. A source electrode 65 and a drain electrode 66 are formed on the semiconductor layer 44. In addition, ohmic contact layers 55 and 56 are formed between the semiconductor layer 44 and the source electrode 65 and drain electrode 66.

Referring to FIG. 10A, the gate insulating film 30, an amorphous silicon layer 40, an impurity-doped amorphous silicon layer 50, and a second conductive layer 60 are sequentially formed on the substrate 10 having the gate electrode 24. Here, the gate insulating film 30, the amorphous silicon layer 40, and the impurity-doped amorphous silicon layer 50 are formed by plasma enhanced chemical vapor deposition (PECVD), and the second conductive layer 60 is formed by sputtering. The gate insulating film 30 is made of insulating material such as silicon oxide (SiOx) or silicon nitride (SiNx), and the second conductive is layer 60 may have a single layer or a stack of two more layers made of a metal such as Mo, Ti, Cu, AlNd, Al, Cr, Mo alloy, Cu alloy, or Al alloy.

Next, a second photoresist film 150 is formed on the second conductive layer 60. The second photoresist film 150 is made of substantially the same material as the first photoresist film 100. Here, the second photoresist film 150 may be thicker than the first photoresist film 100, as shown in FIG. 10A.

As shown in FIG. 10A, the laser beam is irradiated into a non-patterning region S10 of the second photoresist film 150 using the digital exposure apparatus shown in FIG. 6. The digital exposure apparatus irradiates the laser beam into the non-patterning region S10 and a channel region S40. The laser beam is not irradiated into a region S30 where source and drain electrodes are to be formed. The second photoresist film 150 exposed to the laser beam is developed to form a second photoresist pattern 151, as shown in FIG. 10B.

Next, as shown in FIG. 10C, a substrate having the second photoresist pattern 151 is subjected to a first etching process to etch a second conductive layer 60 of the non-patterning region S10. Then, the substrate is subjected to a second etching process to etch the impurity-doped amorphous silicon layer 50, and the amorphous silicon layer 40 in the non-patterning region S10. During the etching process, the second photoresist pattern 151 is partially removed, thereby forming a third photoresist pattern 152.

The second conductive layer 64 having the exposed channel region S40 is etched using a third etching process using the third photoresist pattern 152.

As a result, the source electrode 65 and the drain electrode 66 are formed. Next, the exposed impurity-doped amorphous silicon layer 54 of the non-patterning region S10 is etched to form the ohmic contact layers 55 and 56. Finally, the third photoresist pattern 152 is removed by an ashing process using oxygen plasma. Accordingly, a TFT is completely formed on the substrate 10, as shown in FIG. 10D.

Referring to FIG. 11, a passivation film 82 and a contact hole 86 are formed. The passivation film 82 is made of an inorganic insulating material by chemical vapor deposition (CVD) or plasma-enhanced chemical vapor deposition (PECVD). The contact hole 86 may be formed by the photoresist composition prepared in Example 1 using the digital exposure apparatus.

Referring to FIG. 8, the pixel electrode 92 connected to the drain electrode 66 is formed.

The pixel electrode 92 is made of indium tin oxide, tin oxide, indium zinc oxide, or the like, by sputtering. Thereafter, the pixel electrode 92 is exposed using the photoresist pattern formed by the developing process using the digital exposure apparatus. The pixel electrode 92 is electrically connected to the drain electrode 66 through the contact hole 86, as shown in FIG. 8.

As described above, according to the present exemplary embodiment, the TFT is completed. Here, the photoresist composition prepared in Example 1 and the digital exposure apparatus are used. Thus, a TFT substrate can be fabricated without using a mask. In a case of fabricating a TFT substrate using a large-sized panel, the size of a mask used in the manufacture of an LCD may also become large. However, according the present invention, the mask fabrication cost can be reduced, which may ultimately reduce the manufacturing cost of the TFT substrate.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A photoresist composition for digital exposure, comprising:
    a binder resin comprising a novolak resin and a compound represented by chemical formula (1);
    a photosensitizer comprising a diazide-based compound; and
    a solvent:

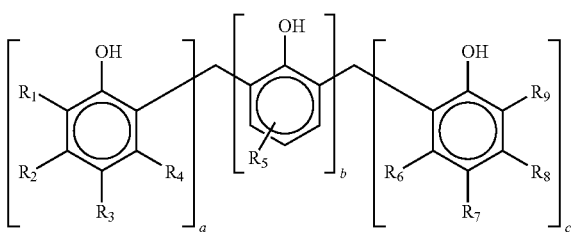

(1)

wherein $R_1$-$R_9$ each comprise a hydrogen atom, an alkyl group, or a benzyl group, a is an integer from 0 to 10, b is an integer from 1 to 100, and c is an integer from 1 to 10.

2. The photoresist composition of claim 1, wherein the photoresist composition comprises 5 to 30 weight % of the binder resin, the photoresist composition comprises 2 to 10 weight % of the photosensitizer, and the remainder of the photoresist composition comprises the solvent, based on a total weight of the photoresist composition.

3. The photoresist composition of claim 1, wherein the novolak resin has a weight average molecular weight ranging from 2,000 to 20,000, and the compound represented by the chemical formula (1) has a weight average molecular weight ranging from 2,000 to 20,000.

4. The photoresist composition of claim 3, wherein the novolak resin and the compound represented by the chemical formula (1) are mixed in a mixing ratio by weight ranging from 1:99 to 80:20.

5. The photoresist composition of claim 3, wherein the novolak resin comprises a meta-cresol novolak component and a para-cresol novolak component, the meta-cresol novolak component and the para-cresol component comprising a mixing ratio by weight ranging from 30:70 to 70:30.

6. The photoresist composition of claim 1, wherein the photosensitizer further comprises a compound represented by chemical formula (2):

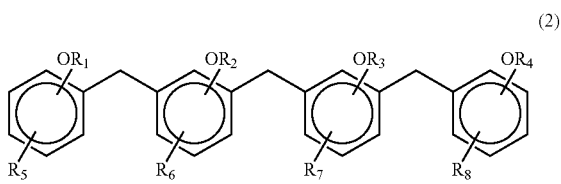

(2)

wherein $R_1$-$R_4$ each comprise 2-diazo-1-naphthol-5-sulfonyl, a hydrogen atom, or an alkyl group, and $R_5$-$R_8$ each comprise a hydrogen atom, an alkyl group, or a benzyl group.

7. The photoresist composition of claim 6, wherein the diazide-based compound and the compound represented by chemical formula (2) are mixed in a mixing ratio by weight ranging from about 1:99 to 80:20.

8. The photoresist composition of claim 7, wherein the diazide-based compound is at least one selected from the group consisting of 2,3,4-trihydroxybenzophenone-1,2-naphthoquinone diazide-5-sulfonate and 2,3,4,4'-tetrahydroxybenzophenone-1,2-naphthoquinone diazide-5-sulfonate.

9. The photoresist composition of claim 1, wherein the solvent is at least one selected from the group consisting of propyleneglycol monoethylether acetate (PGMEA), ethyl lactate (EL), ethyl cellosolve acetate (ECA), 2-methoxyethylacetate, γ-butyrolactone (GBL), methyl methoxy propionate (MMP), ethyl-β-ethoxypropionate (EEP), propylene glycol monomethyl ether (PGME), n propyl acetate (nPAC), and n-butyl acetate (nBA).

10. The photoresist composition of claim 1, further comprising at least one selected from the group consisting of a coloring agent, a dying agent, a streation preventing agent, a plasticizer, an adhesion promoting agent, a photospeed enhancer, and a surfactant.

* * * * *